United States Patent
Dasgupta et al.

(10) Patent No.: US 10,673,405 B2
(45) Date of Patent: Jun. 2, 2020

(54) FILM BULK ACOUSTIC RESONATOR (FBAR) DEVICES WITH 2DEG BOTTOM ELECTRODE

(71) Applicant: INTEL CORPORATION, Santa Clara, CA (US)

(72) Inventors: Sansaptak Dasgupta, Hillsboro, OR (US); Marko Radosavljevic, Portland, OR (US); Han Wui Then, Portland, OR (US); Bruce A. Block, Portland, OR (US); Paul B. Fischer, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/328,753

(22) PCT Filed: Sep. 30, 2016

(86) PCT No.: PCT/US2016/054660
§ 371 (c)(1),
(2) Date: Feb. 27, 2019

(87) PCT Pub. No.: WO2018/063284
PCT Pub. Date: Apr. 5, 2018

(65) Prior Publication Data
US 2019/0199322 A1 Jun. 27, 2019

(51) Int. Cl.
*H01L 41/316* (2013.01)
*H01L 41/297* (2013.01)
(Continued)

(52) U.S. Cl.
CPC ............. *H03H 9/173* (2013.01); *H01L 27/20* (2013.01); *H01L 41/0471* (2013.01);
(Continued)

(58) Field of Classification Search
None
See application file for complete search history.

(56) References Cited

U.S. PATENT DOCUMENTS

2014/0110722 A1\* 4/2014 Kub ................. H01L 29/66462
257/77
2015/0364669 A1\* 12/2015 Rais-Zadeh ........... H01L 41/107
257/76
(Continued)

FOREIGN PATENT DOCUMENTS

WO 2018063284 A1 4/2018

OTHER PUBLICATIONS

International Search Report and Written Opinion received for PCT/US2016/054660, dated May 24, 2017. 15 pages.
(Continued)

*Primary Examiner* — Herve-Louis Y Assouman
(74) *Attorney, Agent, or Firm* — Finch & Maloney PLLC

(57) ABSTRACT

Techniques are disclosed for forming high frequency film bulk acoustic resonator (FBAR) devices that include a bottom electrode formed of a two-dimensional electron gas (2DEG). The disclosed FBAR devices may be implemented with various group III-nitride (III-N) materials, and in some cases, the 2DEG may be formed at a heterojunction of two epitaxial layers each formed of III-N materials, such as a gallium nitride (GaN) layer and an aluminum nitride (AlN) layer. The 2DEG bottom electrode may be able to achieve similar or increased carrier transport as compared to an FBAR device having a bottom electrode formed of metal. Additionally, in some embodiments where AlN is used as the piezoelectric material for the FBAR device, the AlN may be epitaxially grown which may provide increased performance as compared to piezoelectric material that is deposited by traditional sputtering techniques.

20 Claims, 5 Drawing Sheets

(51) Int. Cl.

| | |
|---|---|
| *H01L 41/187* | (2006.01) |
| *H01L 41/083* | (2006.01) |
| *H01L 41/047* | (2006.01) |
| *H01L 27/20* | (2006.01) |
| *H03H 9/17* | (2006.01) |
| *H03H 9/58* | (2006.01) |
| *H03H 3/02* | (2006.01) |
| *H01L 41/08* | (2006.01) |
| *H03H 9/02* | (2006.01) |
| *H03H 9/13* | (2006.01) |
| *H03H 9/54* | (2006.01) |
| *H03H 9/56* | (2006.01) |
| *H03H 9/564* | (2013.01) |
| *H03H 9/587* | (2013.01) |
| *H03H 2003/021* | (2013.01) |

(52) U.S. Cl.
CPC ........ *H01L 41/0477* (2013.01); *H01L 41/081* (2013.01); *H01L 41/083* (2013.01); *H01L 41/187* (2013.01); *H01L 41/297* (2013.01); *H01L 41/316* (2013.01); *H03H 3/02* (2013.01); *H03H 9/02015* (2013.01); *H03H 9/133* (2013.01); *H03H 9/545* (2013.01); *H03H 9/564* (2013.01); *H03H 9/587* (2013.01); *H03H 2003/021* (2013.01)

(56) References Cited

U.S. PATENT DOCUMENTS

| | | |
|---|---|---|
| 2015/0381144 A1 | 12/2015 | Bradley et al. |
| 2016/0155673 A1 | 6/2016 | Kang |
| 2016/0182011 A1 | 6/2016 | Burak et al. |
| 2016/0197593 A1 | 6/2016 | Hurwitz et al. |

OTHER PUBLICATIONS

International Preliminary Report on Patentability received for PCT/US2016/054660, dated Apr. 2, 2019. 11 pages.

Rais-Zadeh, et al., "Gallium Nitride as an Electromechanical Material," Journal of Microelectromechanical Systems, vol. 23, No. 6. Dec. 2014. pp. 1252-1271.

* cited by examiner

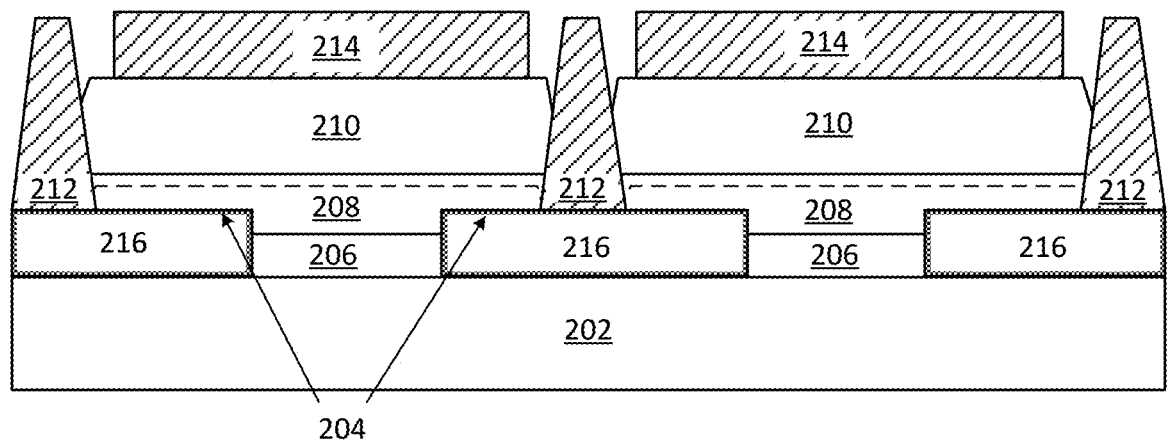
FIG. 3D
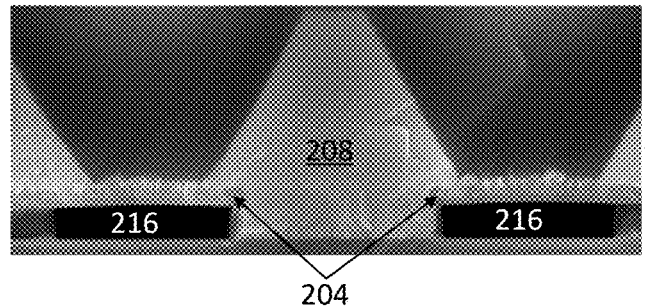
FIG. 3D'
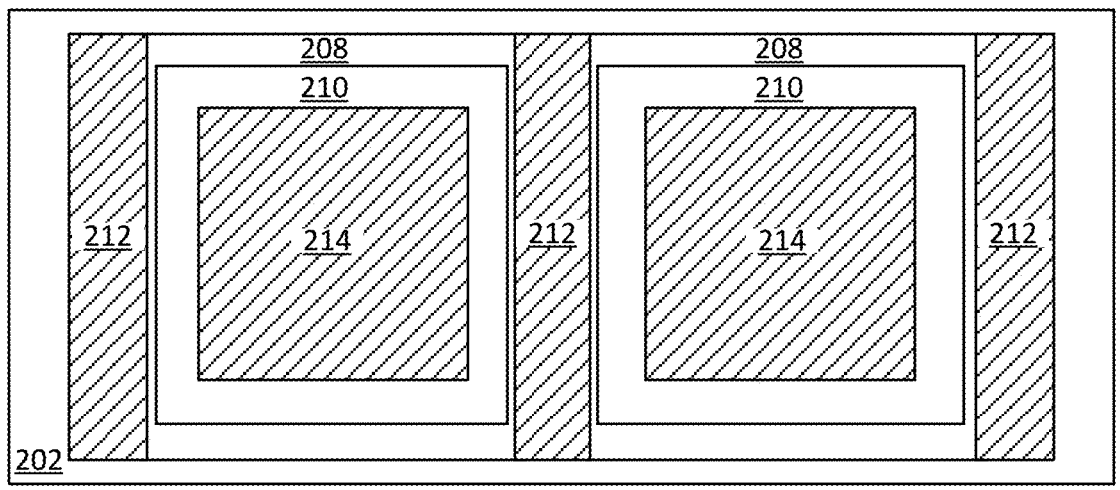
FIG. 3D"

FILM BULK ACOUSTIC RESONATOR (FBAR) DEVICES WITH 2DEG BOTTOM ELECTRODE

BACKGROUND

Modern communication systems utilize radio frequency (RF) filters to convert electrical energy into mechanical energy and vice versa. Some RF filters employ film bulk acoustic resonators (FBARs), sometimes called thin-film bulk acoustic resonators (TFBARs). With the growing number of frequency bands and modes of communications, the quantity of RF filters in a typical mobile device has significantly increased.

BRIEF DESCRIPTION OF THE DRAWINGS

FIGS. 3A-3D" illustrate example integrated circuit structures that may be formed when carrying out the method of FIG. 2, in accordance with various embodiments of the present disclosure.

Figure 1:
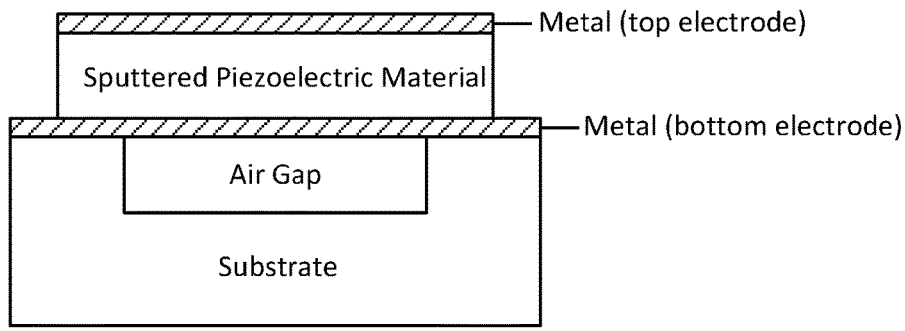
FIG. 1 illustrates a cross-section view of a film bulk acoustic resonator (FBAR) structure formed with a metal bottom electrode and a sputtered piezoelectric element.

As will be appreciated, the figures are not necessarily drawn to scale or intended to limit the disclosure to the specific configurations shown. For instance, while some figures generally indicate straight lines, right angles, and smooth surfaces, an actual implementation of a structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for forming high frequency film bulk acoustic resonator (FBAR) devices having a bottom electrode formed of a two-dimensional electron gas (2DEG). In some cases, the 2DEG is formed at a heterojunction of two epitaxial layers formed of group III-V materials, including group III material-nitride (III-N) compounds. In some such embodiments, a piezoelectric film may be used as a polarization layer and be positioned on a III-N layer that has a smaller band gap than the piezoelectric material. The polarization layer may, in some embodiments, include epitaxial III-N material(s). For example, in some particular embodiments, the 2DEG bottom electrode may be formed in a gallium nitride (GaN) III-N layer positioned under a polarization layer implemented with aluminum nitride (AlN).

The disclosed FBAR devices may provide numerous benefits as compared to FBAR devices that include metal electrodes and/or sputtered piezoelectric material. For example, an FBAR device that includes a 2DEG bottom electrode may be able to achieve similar or increased carrier transport as compared to an FBAR device having a bottom electrode formed of metal. Additionally, FBAR devices that include epitaxial piezoelectric films as disclosed herein may have increased performance as compared to FBAR devices having piezoelectric materials deposited by sputtering, which limits the quality of the material. Specifically, the structure of a film formed by sputtering is not monocrystalline, and is instead amorphous or polycrystalline. The disclosed epitaxial piezoelectric films, in contrast, may have a structure that is at least partially monocrystalline (sometimes referred to as single crystal), as a result of epitaxy. To this end, use of "epitaxial" herein as an adjective (e.g., epitaxial layer) is intended to refer to the single crystal structure of at least part of the layer being described. In some embodiments, the piezoelectric material of the disclosed FBAR devices may have a relatively small X-ray rocking curve FWHM value, indicating a higher crystallographic quality and thus a higher piezoelectric coupling coefficient, which leads to RF filters including such FBAR devices having higher Q-factors. Therefore, the techniques variously described herein can be used to form higher quality FBAR structures and thus higher quality RF filters, even when the RF filters are used to filter high frequencies (e.g., 3 GHz or greater). Numerous other configurations and variations will be apparent in light of this disclosure.

General Overview

Radio Frequency (RF) interference can inhibit communication and RF filters or resonators can be incorporated into communication devices to filter RF interference. Bulk acoustic wave (BAW) filters are a type of RF filter that function by resonating vertically. A film bulk acoustic resonator (FBAR) is a type of BAW filter that includes an air cavity formed under a suspended film of piezoelectric material, allowing the piezoelectric film to resonate. The FBAR device also includes a bottom electrode and a top electrode. In FBAR devices, the resonance frequency is determined by the thickness of a piezoelectric layer as well as the thickness of the resonator electrodes and additional layers in which mechanical energy may be stored. In such piezoelectric resonators, an acoustic standing wave is generated within the piezoelectric layer. In this way, such filters can selectively pass RF data of interest when a signal is applied to the filter that triggers the resonant response. FIG. 1 illustrates the structure of an example FBAR device that employs metal electrodes and sputtered piezoelectric material.

In contrast, and in accordance with embodiments of the present disclosure, an FBAR device is configured with a bottom electrode formed of a two-dimensional electron gas (2DEG) layer. In accordance with these and other embodiments of the subject disclosure, the piezoelectric material of the FBAR device may be formed, at least partially, using lateral epitaxial overgrowth or so-called LEO techniques to produce an epitaxial film. The disclosed FBAR devices having 2DEG bottom electrodes can provide comparable or improved carrier transport, relative to FBAR devices with metal bottom electrodes. Additionally, as will be further appreciated in light of this disclosure, the disclosed FBAR devices may include epitaxial piezoelectric materials that have increased purity and monocrystalline structure relative to piezoelectric materials deposited by sputtering, thereby preserving performance of the FBAR device.

In accordance with some example embodiments, the piezoelectric material of the disclosed FBAR devices may be implemented with various group III-V materials, including group III-nitride (III-N) compounds, including aluminum nitride (AlN) and/or gallium nitride (GaN). Due to its piezoelectricity, AlN may be particularly useful for implementing high performance RF filters, such as FBAR devices.

From a structural viewpoint, the disclosed FBAR devices as provided herein may include various cross-section profiles. For example, in some embodiments, the FBAR device may include a III-N layer, a polarization layer formed on the III-N layer, an air cavity formed underneath the III-N layer, a top electrode formed on the polarization layer, and a bottom electrode comprising a 2DEG region formed in the III-N layer. In some embodiments, the polarization layer may be implemented with aluminum nitride, and in some example structures the aluminum nitride may be at least partially formed by lateral epitaxial overgrowth techniques to form an epitaxial film. In some particular embodiments, the disclosed FBAR devices may also include an epitaxial nucleation layer comprising III-N material positioned under the III-N layer, which may allow the III-N layer and the polarization layer to be epitaxially formed on a silicon substrate. Depending on method of formation, some example FBAR devices as presently disclosed may include shallow trench isolation (STI) material lining the air cavity, which may, in some circumstances, provide structural support for the components of the FBAR device.

While this example FBAR device discussed in detail includes a III-N layer implemented with GaN and a polarization layer implemented with AlN, it is important to note that any other suitable III-N materials may be used in alternative embodiments, as will be appreciated. Additionally, although FBAR devices are discussed in detail throughout the subject disclosure, note, however, that the subject disclosure is not intended to be limited to FBARs and the disclosed techniques may be used to form other types of RF filter structures instead of or in addition to FBARs. Numerous configurations and variations will be apparent in light of the subject disclosure.

Use of the techniques and structures provided herein may be detectable in cross-sections of an integrated circuit using tools such as scanning electron microscopy (SEM) or transmission electron microscopy (TEM) that can show the various layers and structure of the device. Other methods, such as composition mapping, x-ray crystallography or diffraction (XRD), secondary ion mass spectrometry (SIMS), time-of-flight SIMS (ToF-SIMS), atom probe imaging, local electrode atom probe (LEAP) techniques, 3D tomography, or high resolution physical or chemical analysis, to name some suitable example analytical tools may also be used to detect the techniques and structures provided herein. In some embodiments, for instance, a SEM may indicate an FBAR device having a III-N 2DEG bottom electrode and an epitaxial III-N material stack. Numerous configurations and variations will be apparent in light of this disclosure.

The semiconductor structures variously described herein may be suitable for numerous applications, such as the personal computers (PC), tablet computers, smartphones, test equipment, power management and communication applications, as well as power conversion and automotive applications, to name a few examples. The structure may be included in an integrated circuit chip or chip set, such as a system-on-chip (SOC). Numerous configurations and variations will be apparent in light of this disclosure.

Architecture and Methodology

Figure 2:
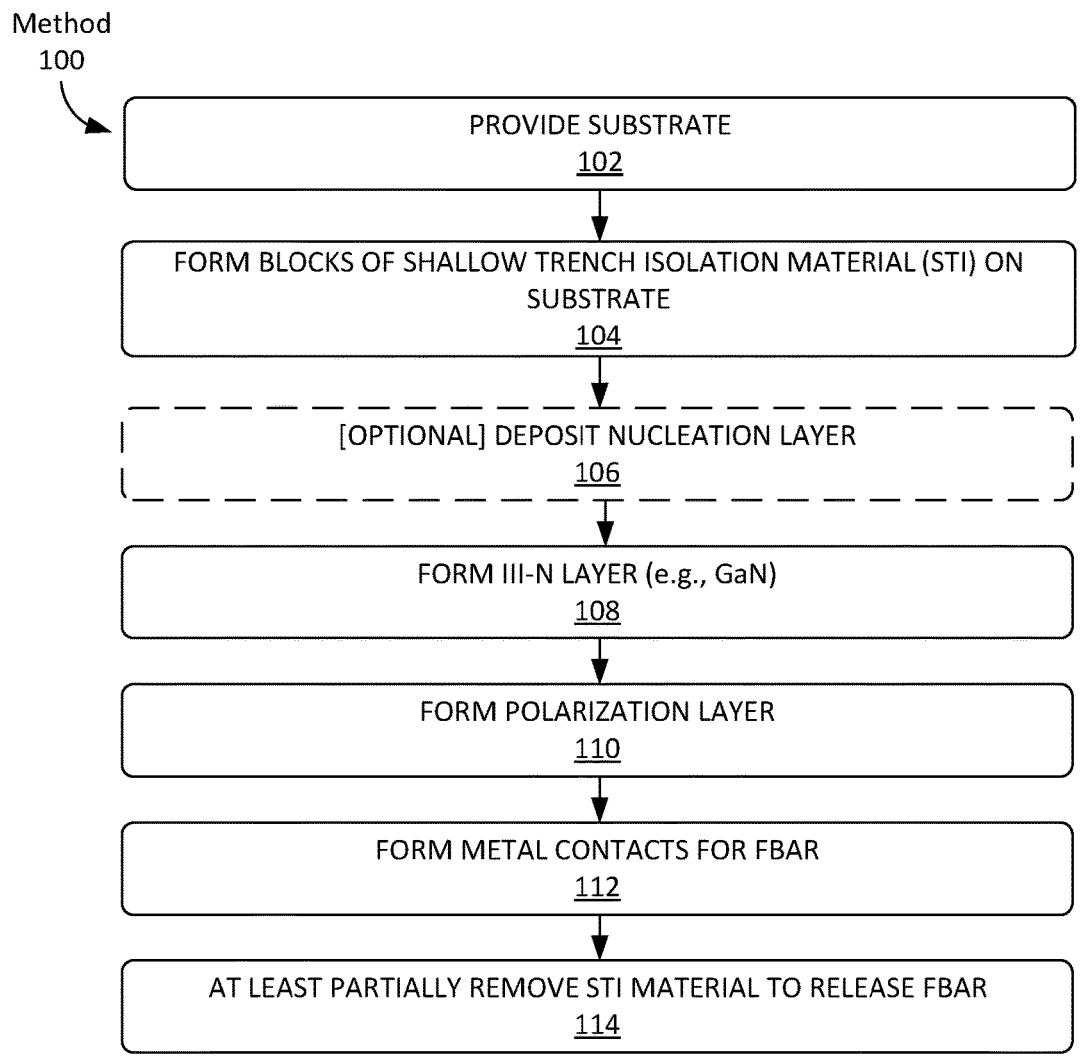
FIG. 2 illustrates an example methodology for producing an FBAR device having a III-N 2DEG bottom electrode, in accordance with one or more embodiments of the present disclosure.

FIG. 2 illustrates a method 100 of forming an RF filter having a 2DEG bottom electrode in accordance with one or more embodiments of the present disclosure. FIGS. 3A-3D" illustrate example structures that may be formed when carrying out method 100 of FIG. 2, in accordance with some embodiments. As will be appreciated in light of this disclosure, the disclosed techniques may be used to form various types of RF Filters, such as, for example, bulk acoustic wave (BAW) filters, including film bulk acoustic resonators (FBARs) and thin-film bulk acoustic resonators (TFBARs).

Figure 3A:
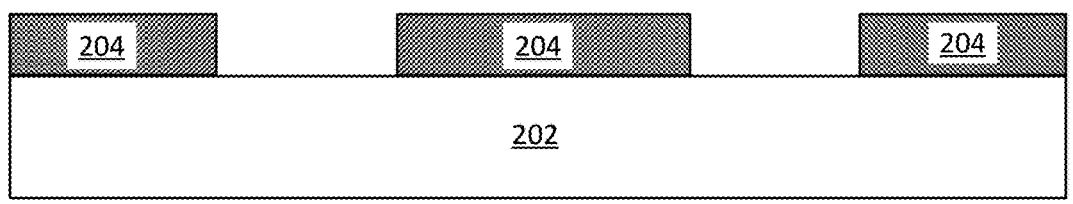
Figure 3A:
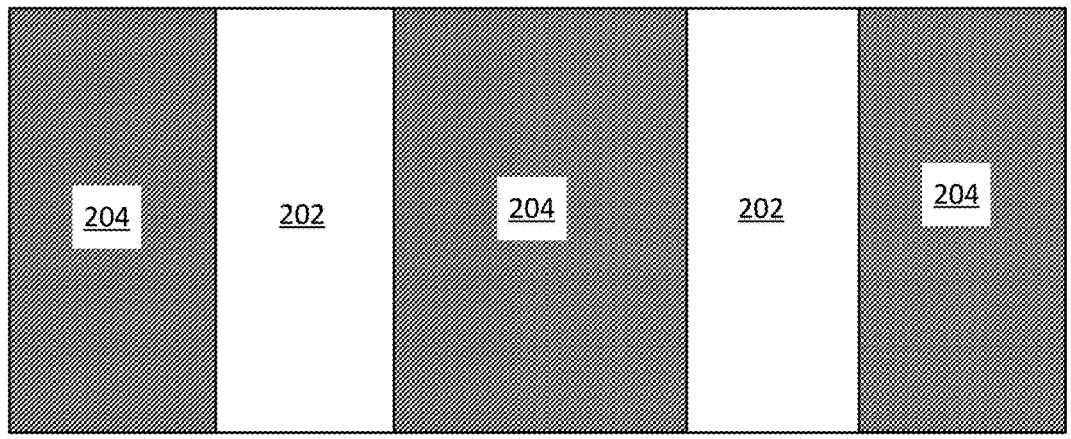

As shown in FIG. 2, method 100 includes providing 102 a substrate and forming 104 blocks of shallow trench isolation material (STI) on the substrate to produce a structure as shown in FIG. 3A (side view) and FIG. 3A' (top view), in accordance with an example embodiment. Substrate 202 may be formed of any suitable semiconductor material, including group IV semiconductor materials such as silicon (Si), silicon carbide (SiC), sapphire, germanium (Ge), or silicon germanium (SiGe). In some embodiments, substrate 202 may be an X on insulator (XOI) structure where X comprises Si, Ge, SiC, SiGe, or sapphire, and the insulator material may be an oxide material, a dielectric material, some other electrically insulating material, or a multilayer structure where the top layer comprises Si, Ge, SiC, SiGe, or sapphire. In some embodiments where substrate 202 is implemented with silicon, the silicon may be prepared to expose a particular plane of its crystal structure as defined by a Miller index number. For example, in some embodiments, substrate 202 may include Si 111, Si 110, Si 100 with an offcut of between 2 to 8 degrees toward 110, or equivalents thereof. Substrate 202 may have any suitable thickness, such as a thickness in the range of 100 to 950 microns, in the case of a bulk substrate. STI material 204 may comprise any suitable insulating material, such as one or more oxides (e.g., silicon dioxide) and/or nitrides (e.g., silicon nitride). In some embodiments, the STI material 204 may be selected based on the substrate material. For example, in the case of a silicon substrate 202, STI material 204 may be silicon dioxide or silicon nitride. As shown in FIGS. 3A (side view) and 3A' (top view), blocks of STI material 204 may be deposited on substrate 202. Blocks of STI material 204 may have any suitable dimensions, including a width between 50 and 100 μm and a height between 100 and 500 nm. Blocks of STI material 204 may be spaced apart from one another on substrate 202 and in some embodiments there may be between 50 and 100 μm between blocks of STI material 204. Blocks of STI material 204 may be formed on substrate 202 by any suitable technique, including by chemical vapor deposition (CVD), atomic layer deposition (ALD), physical vapor deposition (PVD), or any other appropriate process. Various lithography techniques may be used to form blocks of STI material 204, for example a layer of STI material may be deposited on substrate 202 and then be selectively etched to form blocks of STI material 204. Numerous configurations will be apparent in light of the present disclosure.

Figure 3B:
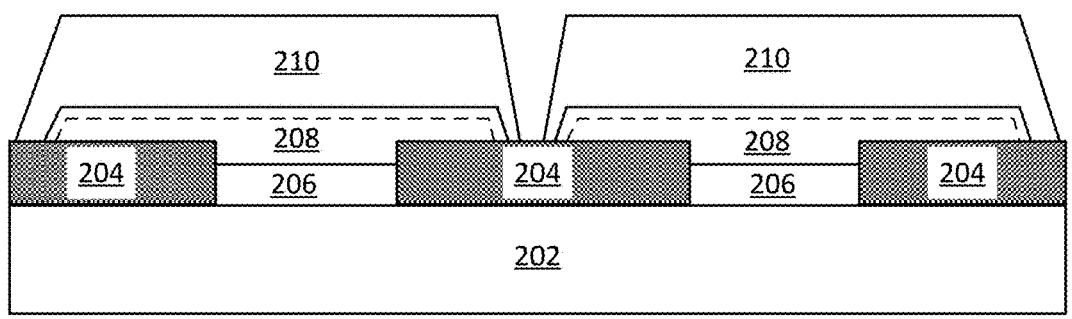

Method 100 of FIG. 2 continues with optionally depositing a nucleation layer on the substrate to form a structure as shown in FIG. 3B, in accordance with an example embodiment. Nucleation layer 206, if present, may be positioned between the blocks of STI material 204 and in some embodiments may have a thickness that is less than the thickness of adjacent blocks of STI material 204, as shown in FIG. 3B. Nucleation layer 206 may be formed to prevent subsequent layers (e.g., layer 208) from reacting with the substrate material. However, in some embodiments, nucleation layer 206 may not be needed, for example, where layer 208 is compatible with substrate 202. Accordingly, in some embodiments, nucleation layer 206 may be optional. If present, nucleation layer 206 may be implemented with a III-V material, such as AlN, AlGaN, or a low temperature GaN (e.g., epitaxially grown at a temperature in the range of 700 to 900° C., or any other appropriate material. In some particular embodiments, nucleation layer 206 may have a thickness between 0.05 to 1 micron (e.g., 50 to 200 nm), less than 200 nm, less than 150 nm, less than 100 nm, or less than 50 nm, depending on end use or target application. Nucleation layer 206 may be formed by any suitable process, such as by metal-organic chemical vapor deposition (MOCVD), molecular beam epitaxy (MBE), hydride vapor phase epitaxy (HVPE), in some embodiments.

Method 100 of FIG. 2 continues with forming 106 a III-N layer on nucleation layer 206 (if present) and STI material 204 to produce a structure as shown in FIG. 3B, in accordance with an example embodiment. III-N layer 208 may be implemented with gallium nitride (GaN), or another III-N material, such as aluminum nitride (AlN) or indium nitride (InN). As used herein, group III-N semiconductor material (or III-N material or simply III-N) includes a compound of one or more group III elements (e.g., aluminum, gallium, indium, boron, thallium), with nitrogen. Accordingly, III-N material as used herein includes, but is not limited to, gallium nitride (GaN), indium nitride (InN), aluminum nitride (AlN), aluminum indium nitride (AlInN), aluminum gallium nitride (AlGaN), indium gallium nitride (InGaN), and aluminum indium gallium nitride (AlInGaN), to name a few examples of III-N materials. In a more inclusive manner, note that a group III-V material, as used herein, includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. Numerous group III-V material systems can be used to implement FBAR devices as provided here in various embodiments of the present disclosure. In some embodiments, III-N layer 208 comprises at least 50%, at least 60%, at least 70%, at least 80%, at least 90%, at least 95%, or 100% GaN. In some embodiments, III-N layer 208 may have a thickness of less than, more than, or approximately 100 nm on the STI material 204. In some embodiments where III-N layer 208 is implemented with GaN, the GaN may be epitaxially grown, such as by liquid phase epitaxy (LPE), MOCVD, HVPE, MBE, or any other suitable deposition process. In some embodiments, growth conditions may be adjusted based on the desired resulting characteristics of the III-N layer.

Method 100 of FIG. 2 continues with forming 110 a polarization layer 210 on III-N layer 208 to produce a structure as shown in FIG. 3B, in accordance with an example embodiment. Polarization layer 210 may include any type of III-V compounds, such as AlN, GaN, InN, or other III-N materials. The thickness of polarization layer 210 may vary based on the end use or desired application. For example, in some embodiments, polarization layer 210 may have a thickness between 1 and 2 microns. In embodiments where the FBAR structure is to be used in an RF filter, the thickness of polarization layer 210 may be selected based on the desired frequency to be filtered by the RF filter device. For example, a thinner polarization layer 210 may be used to filter higher frequencies (e.g., frequencies greater than 1, 2, 3, 4, or 5 GHz) whereas a thicker polarization layer may be used to filter lower frequencies (e.g., frequencies less than 1 GHz). Polarization layer 210 may be formed by any suitable process, and in some embodiments polarization layer 210 may be epitaxially grown on III-N layer 208, such as by MOCVD, HVPE, or MBE. In embodiments where polarization layer 210 includes an epitaxial III-N material (e.g., AlN), the III-N material may have a crystallinity characterized by an X-ray rocking curve FWHM of less than 2 degrees, 1.5 degrees, 1 degree, 0.5 degrees, or some other suitable maximum as will be apparent in light of the present disclosure. In some embodiments, the entire thickness of polarization layer 210 may be formed of epitaxial material, whereas in other embodiments, only a portion of polarization layer 210 may be formed of epitaxial material. For example, a portion of polarization layer 210 may be epitaxially grown on III-N layer 208 and additional material may then be sputtered or otherwise deposited on the epitaxial material of the polarization layer to complete formation of polarization layer 210, in some embodiments. In some such embodiments, at least 5%, at least 10%, at least 20%, or at least 25% of polarization layer 210 may include epitaxial material.

In some example embodiments, a two-dimensional electron gas (2DEG) region may be formed in the III-N layer due to the built-in electric field caused at the heterojunction of III-N layer 208 and polarization layer 210 that can provide increased carrier mobility. Example 2DEG regions in III-N layer 208 are illustrated in FIG. 3B. In some embodiments, polarization layer 210 may be implemented with a material having a larger bandgap than the material of III-N layer 208. For example, in some particular embodiments, polarization layer may be formed of AlN and III-N layer 208 may be formed of GaN.

Figure 3C:
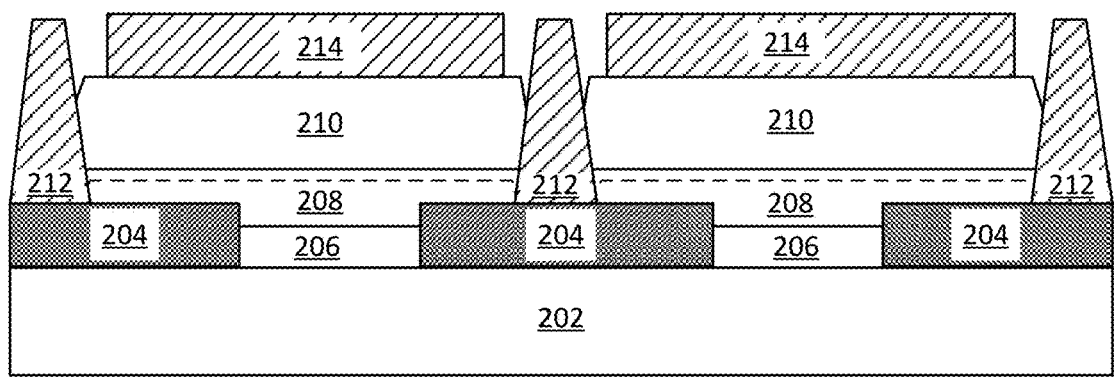

Method 100 of FIG. 2 continues with forming 112 metal contacts for FBAR device to produce a structure as shown in FIG. 3C. As shown in FIG. 3C, bottom electrode contact 212 may be formed on STI material 204 and may contact the sidewall of the 2DEG region formed at the interface of III-N layer 208 and polarization layer 210. The bottom electrode contact 212 may thus allow the 2DEG to serve as the bottom electrode of the FBAR device. Top electrode 214 may be formed on polarization layer 210, as shown in FIG. 3C, in accordance with some example embodiments. Bottom electrode contact 212 and top electrode 214 may be implemented with any suitable materials, including hard metals, such as tungsten (W) and/or molybdenum (Mo). In some embodiments, bottom electrode contact 212 may be formed of the same material(s) as top electrode 214 while in other embodiments bottom electrode contact 212 and top electrode 214 may be formed of different material(s). In some embodiments, top electrode 214 may have a thickness of between 100 and 300 nm. Bottom electrode contact may be formed to have any desired thickness. For example, in some embodiments, bottom electrode contact may be formed to have a top surface at approximately the same height as the top electrode or, in other embodiments, may be formed to have a top surface below the height of the top electrode. In some particular embodiments, bottom electrode contact may have a thickness of between 1 micron and 3 microns, such as between 1.2 microns and 2.4 microns. Formation of top electrode 214 and bottom electrode contact 212 may include any suitable deposition and/or patterning processes, such as an atomic layer deposition (ALD) process, for example. In some embodiments, various layers, including III-N layer 208 and/or polarization layer 210 may be formed with one or more sloped edges to provide access for bottom electrode contact 212, as shown in FIG. 3B. However, in accordance with some other embodiments, III-N layer 208 and polarization layer each may be substantially planar. In various embodiments, III-N layer 208 and/or polarization layer 110 may be partially etched to form a trench in which bottom electrode contact 212 may be formed. Numerous configurations and variations will be apparent in light of the subject disclosure.

Method 100 of FIG. 2 continues with at least partially removing 114 STI material 204 to release FBAR structure and form air cavity to provide a structure as shown in FIG. 3D, in accordance with some example embodiments. STI material 204 may be removed by any appropriate technique, including by one or more etching processes, and in some embodiments may include the use of buffered or unbuffered hydrofluoric acid (HF) and/or TriMix etchant. In some embodiments, the etch chemistry used to remove STI material 204 is selective to the STI material 204 (i.e., it only removes the STI material 204 and doesn't remove (or otherwise only minimally removes) the other exposed materials. Note that air cavity 215 may be formed to have any desired width, depending on end use or target application. In some particular example embodiments, STI material 204 may be laterally etched. For example, as opposed to methods that remove material in a downward direction, in a lateral etching method an etchant may remove STI material 204 laterally (e.g., from the sides), in some examples. Upon formation of air cavity 216 by removal of STI material 204, the FBAR structure is released, allowing the piezoelectric material to resonate.

As shown in FIG. 3D, some STI material 204 may remain after etching or other STI removal processes. FIG. 3D' is an electron microscope image of residual STI material 204 present after etching an example structure containing STI material 204 and a III-N layer 208 to form air cavity 216. In particular, FIG. 3D' shows possible real-world structural features that may be present in an FBAR device formed by the disclosed methods. Specifically, FIG. 3D' shows that residual STI material may be present between the top of an air cavity, contacting III-N layer 208. Residual STI material 204 may also be present on vertical sidewalls of the air cavity as well as on the bottom surface of the air cavity. In some embodiments, high temperatures used for epitaxial growth allow residual STI material 204 to remain adhered to III-N layer 208 and/or other regions adjacent to air cavity 216 (e.g., substrate 202 and nucleation layer 206) even after etching. In addition to other possible benefits, residual STI material 204 may provide support for the FBAR structure.

FIG. 3D" is a top view of the structure shown in FIG. 3D, in accordance with some example embodiments. As shown in FIG. 3D", top electrode 214 and bottom electrode contact 212 may be available for contact from above. It will be understood that although depicted linearly in FIG. 3D", the components of the disclosed FBAR devices (e.g., substrate 202, III-N layer 208, polarization layer 210, bottom electrode contact 212 and/or top electrode 214) may be non-linear, in some embodiments.

Figure 4:
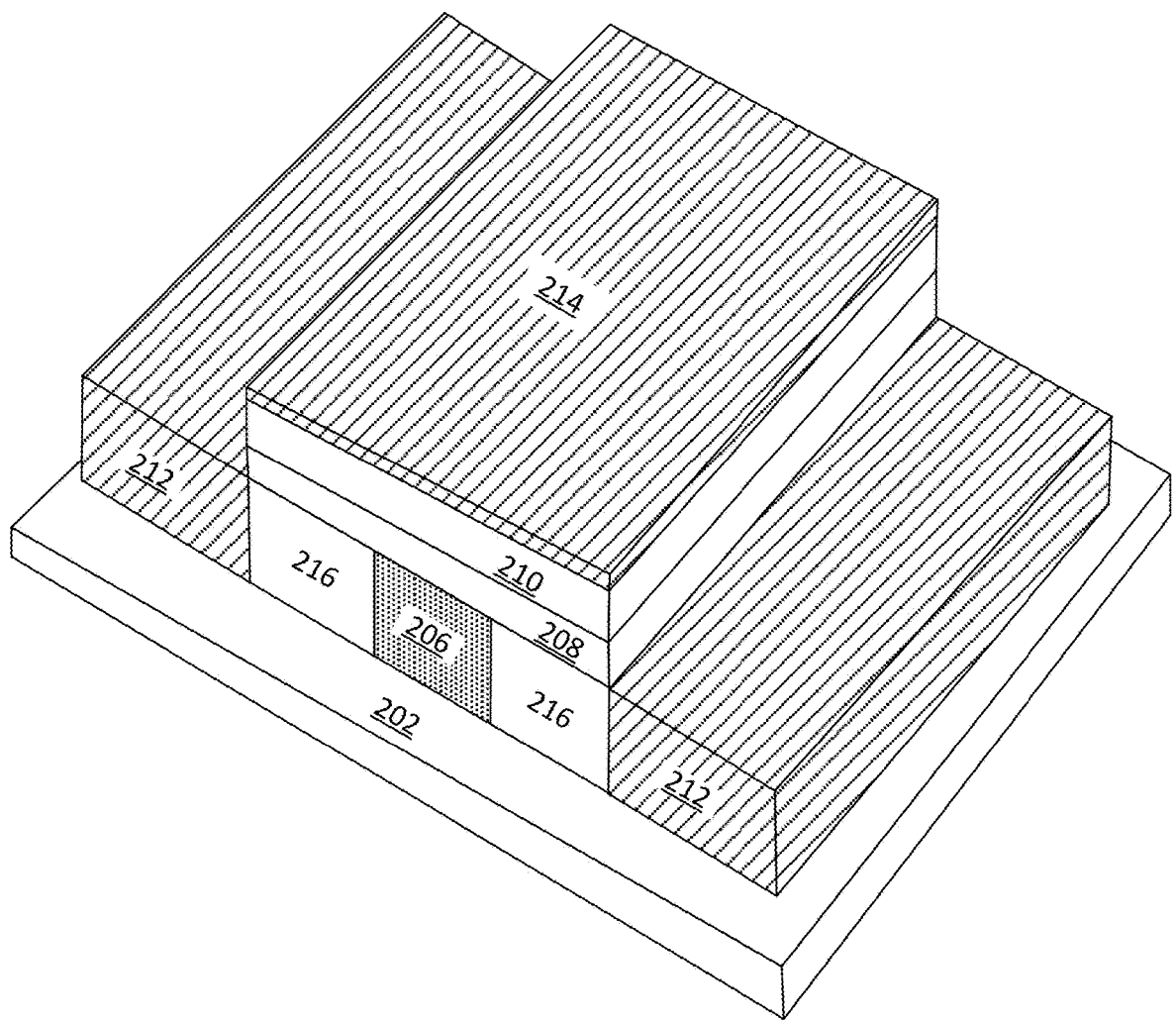
FIG. 4 illustrates a 3-dimensional view of an example FBAR device having a III-N 2DEG bottom electrode, in accordance with one or more embodiments of the present disclosure.

FIG. 4 illustrates a 3-dimensional view of an example FBAR device having a III-N 2DEG bottom electrode, in accordance with one or more embodiments of the present disclosure. As shown in FIG. 4, bottom electrode contact 212 may be slightly recessed from top electrode 214, in accordance with some example embodiments. Additionally, as shown in FIG. 4, air cavity 216 may be positioned adjacent to bottom electrode contact 212 as opposed to being positioned below bottom electrode contact 212, as shown in FIG. 3D. It will be understood that the topography of the disclosed FABR devices could appear otherwise than as shown in FIG. 4. For example, the features of the disclosed FBAR devices may, in some cases, be asymmetrical or sloped and in some cases, the surface of one or more of the features illustrated may be slanted or otherwise non-linear, in some embodiments. Numerous configurations and variations will be apparent in light of the subject disclosure.

In some embodiments, one or more other integrated circuit (IC) devices, such as various diodes (e.g., light-emitting diodes (LEDs) or laser diodes), various transistors (e.g., metal-oxide field-effect transistors (MOSFETs) or tunnel FETs (TFETs)), various microelectromechanical systems (MEMS), various nanoelectromechanical systems (NEMS), various sensors, or any other suitable semiconductor or IC devices, may also be formed on substrate 202, depending on the end use or target application. Accordingly, in some embodiments, FBAR structures as described herein may be included in various system-on-chip (SoC) applications, as will be apparent in light of the present disclosure.

Upon analysis (e.g., using scanning/transmission electron microscopy (SEM/TEM), composition mapping, secondary ion mass spectrometry (SIMS), atom probe imaging, 3D tomography, etc.), a structure or device configured in accordance with one or more embodiments will effectively show the components of the disclosed FBAR structures (e.g., FBAR devices having an epitaxial III-N 2DEG bottom electrode).

Example System

Figure 5:
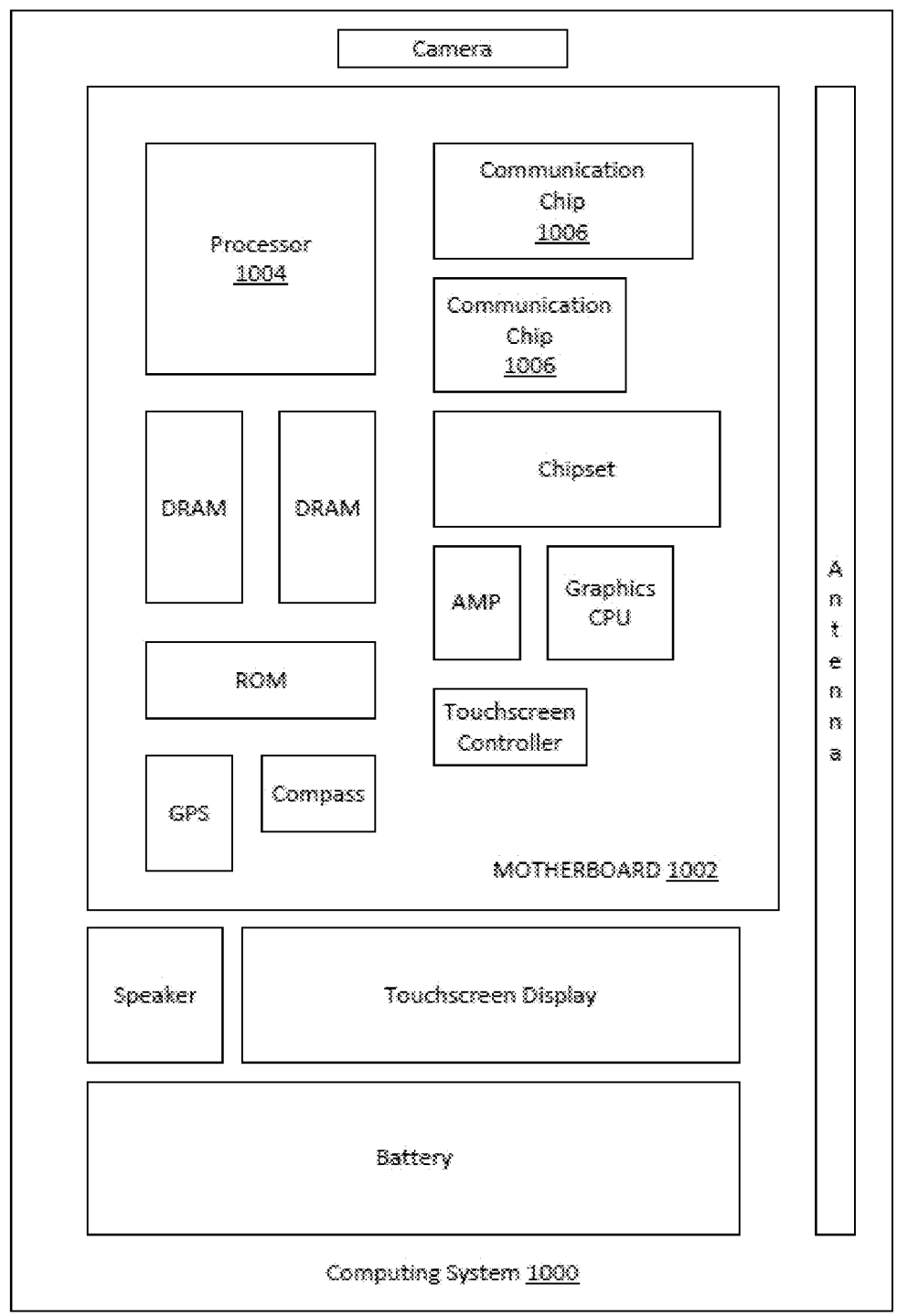
FIG. 5 illustrates an example computing system implemented with one or more integrated circuit structures or devices formed using the techniques disclosed herein, in accordance with various embodiments of the present disclosure.

FIG. 5 illustrates a computing system 1000 implemented with integrated circuit structures or devices formed using the techniques disclosed herein, in accordance with various embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, the communication chip 1006 is implemented with or otherwise includes FBAR devices having an epitaxial 2DEG bottom electrode as variously described herein.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., FBAR devices having an epitaxial 2DEG bottom electrode) formed using the disclosed techniques, as variously described herein. The term "processor" may refer to any device or portion of a device that processes, for instance, electronic data from registers and/or memory to transform that electronic data into other electronic data that may be stored in registers and/or memory. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a radio frequency (RF) filter device that includes a III-N layer that includes a single crystal III-N compound, a polarization layer at least partially including single crystal material on the III-N layer, an air cavity underneath at least a portion of the III-N layer and a bottom electrode that includes a two-dimensional electron gas (2DEG) region formed in the III-N layer.

Example 2 includes the subject matter of Example 1, wherein the polarization layer includes aluminum nitride.

Example 3 includes the subject matter of Example 2, wherein all of the aluminum nitride is epitaxially grown.

Example 4 includes the subject matter of Example 2, wherein at least 10% of the aluminum nitride is epitaxially grown, such that at least 10% of the aluminum nitride is single crystal.

Example 5 includes the subject matter of Example 2, wherein at least 20% of the aluminum nitride is epitaxially grown, such that at least 20% of the aluminum nitride is single crystal.

Example 6 includes the subject matter of any of Examples 1-5 and further includes a top electrode formed on the polarization layer.

Example 7 includes the subject matter of Example 6, wherein the top electrode includes tungsten or molybdenum.

Example 8 includes the subject matter of any of Examples 1-7 and further includes a nucleation layer under the III-N layer and adjacent to the air cavity.

Example 9 includes the subject matter of Example 8, wherein the nucleation layer includes an epitaxial III-N material.

Example 10 includes the subject matter of Example 8, wherein the nucleation layer includes at least one single crystal material selected from the group consisting of aluminum nitride, aluminum indium nitride, aluminum gallium nitride, indium gallium nitride, aluminum indium gallium nitride and gallium nitride.

Example 11 includes the subject matter of any of Examples 1-10 and further includes a substrate underneath the nucleation layer.

Example 12 includes the subject matter of Example 11, wherein the substrate includes a single crystal silicon layer.

Example 13 includes the subject matter of Example 12, wherein the silicon substrate includes Si 111, Si 110, Si 100 with an offcut of between 2 to 8 degrees toward 110.

Example 14 includes the subject matter of any of Examples 1-13 and further includes a shallow trench isolation (STI) material positioned between the air cavity and the III-N layer.

Example 15 includes the subject matter of Example 14, wherein the STI material includes silicon oxide.

Example 16 includes the subject matter of any of Examples 1-15, wherein the III-N layer includes single crystal gallium nitride (GaN).

Example 17 includes the subject matter of any of Examples 1-16, wherein the RF filter device is one of a bulk acoustic wave filter or a thin-film bulk acoustic resonator.

Example 18 is a system-on-chip (SoC) that includes the subject matter of any of Examples 1-17.

Example 19 is a mobile computing system that includes the subject matter of any of Examples 1-18.

Example 20 is a film bulk acoustic resonator (FBAR) device that includes a III-N layer including a single crystal III-N compound, a polarization layer including a single crystal III-N compound on the III-N layer, an air cavity underneath at least a portion of the III-N layer and a bottom electrode including a two-dimensional electron gas (2DEG) region formed in the III-N layer.

Example 21 includes the subject matter of Example 20, wherein the single crystal III-N compound is aluminum nitride.

Example 22 includes the subject matter of Example 20 or Example 21 and further includes a top electrode formed on the polarization layer.

Example 23 includes the subject matter of Example 22, wherein the top electrode includes tungsten or molybdenum.

Example 24 includes the subject matter of any of Examples 20-23 and further includes a nucleation layer under the III-N layer and adjacent to the air cavity.

Example 25 includes the subject matter of Example 24, wherein the nucleation layer includes a single crystal III-N material.

Example 26 includes the subject matter of Example 24 or Example 25, wherein the nucleation layer includes at least one material selected from the group consisting of aluminum nitride, aluminum indium nitride, aluminum gallium nitride, indium gallium nitride, aluminum indium gallium nitride and gallium nitride, all of which are single crystal.

Example 27 includes the subject matter of any of Examples 20-26 and further includes a substrate underneath the nucleation layer.

Example 28 includes the subject matter of Example 27, wherein the substrate is a single crystal silicon substrate.

Example 29 includes the subject matter of Example 28, wherein the silicon substrate includes Si 111, Si 110, Si 100 with an offcut of between 2 to 8 degrees toward 110.

Example 30 includes the subject matter of any of Examples 20-29 and further includes a shallow trench isolation (STI) material positioned between the air cavity and the III-N layer.

Example 31 includes the subject matter of Example 30, wherein the STI material includes silicon oxide.

Example 32 includes the subject matter of any of Examples 20-31, wherein the III-N layer includes single crystal gallium nitride (GaN).

Example 33 includes the subject matter of any of Examples 1-32, wherein the FBAR device is one of a bulk acoustic wave filter or a thin-film bulk acoustic resonator.

Example 34 is a system-on-chip (SoC) that includes the FBAR device of any one of Examples 20-33.

Example 35 is a mobile computing system that includes the FBAR device of any one of Examples 20-33 or the SoC of Example 34.

Example 36 is a method of producing a resonator device, the method including epitaxially depositing a III-N layer on a monocrystalline substrate, epitaxially depositing at least part of a polarization layer on the III-N layer to provide a two-dimensional electron gas (2DEG) region in the III-N layer adjacent to the polarization layer and forming an air cavity underneath at least a portion of the III-N layer.

Example 37 includes the subject matter of Example 36, wherein the entire polarization layer is formed of a single crystal group III-nitride (III-N) compound.

Example 38 includes the subject matter of Example 37, wherein the III-N compound is aluminum nitride.

Example 39 includes the subject matter of Example 38, wherein the aluminum nitride is epitaxially grown on the III-N layer.

Example 40 includes the subject matter of any of Examples 36-39 and further includes forming a top electrode on the polarization layer.

Example 41 includes the subject matter of Example 40, wherein the top electrode includes tungsten or molybdenum.

Example 42 includes the subject matter of any of Examples 36-41 and further includes forming a nucleation layer on the substrate under the III-N layer.

Example 43 includes the subject matter of Example 42, wherein the nucleation layer includes a single crystal III-N material.

Example 44 includes the subject matter of Example 43, wherein the nucleation layer includes at least one material selected from the group consisting of aluminum nitride, aluminum indium nitride, aluminum gallium nitride, indium gallium nitride, aluminum indium gallium nitride and gallium nitride.

Example 45 includes the subject matter of any of Examples 36-44, wherein the substrate includes a single crystal silicon layer or body.

Example 46 includes the subject matter of Example 45, wherein the silicon substrate includes Si 111, Si 110, Si 100 with an offcut of between 2 to 8 degrees toward 110.

Example 47 includes the subject matter of Example 36 and further includes depositing a shallow trench isolation (STI) material on the substrate and etching the STI material to form the air cavity.

Example 48 includes the subject matter of Example 47, wherein the STI material includes silicon oxide.

Example 49 includes the subject matter of any of Examples 36-48, wherein the III-N layer includes a single crystal gallium nitride (GaN).

Example 50 includes the subject matter of any of Examples 36-49 and further includes forming a radio frequency (RF) filter device.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit device, comprising:
    a first layer comprising a first single crystal III-N compound;
    a second layer comprising a second single crystal III-N compound on the first layer;
    an air cavity underneath at least a portion of the first layer; and
    a bottom electrode comprising metal and laterally adjacent to and in contact with sidewalls of the first layer, such that a top portion of the first layer is between portions of the bottom electrode;
    wherein a two-dimensional electron gas (2DEG) region is inducible in the first layer.

2. The device of claim 1, wherein the first single crystal III-N compound comprises gallium and nitrogen, and the second single crystal III-N compound comprises aluminum and nitrogen.

3. The device of claim 1 further comprising a top electrode on the second layer.

4. The device of claim 3, wherein the bottom electrode and the top electrode comprise tungsten or molybdenum.

5. The device of claim 1 further comprising a third layer comprising a third single crystal III-N compound under the first layer and adjacent to the air cavity.

6. The device of claim 5, wherein the third layer comprises nitrogen and at least one of aluminum, indium, and gallium.

7. The device of claim 1 further comprising a substrate underneath the third layer, wherein the substrate comprises a single crystal silicon layer.

8. The device of claim 1 further comprising an insulation material positioned between the air cavity and the first layer.

9. A mobile computing system comprising the integrated circuit device of claim 1.

10. An integrated circuit device comprising:
    a first layer comprising a first single crystal III-N compound;
    a second layer comprising a second single crystal III-N compound on the first layer;
    an air cavity underneath at least a portion of the first layer;
    an insulation material positioned between the air cavity and the first layer;

a top electrode on the second layer; and a bottom electrode comprising metal and laterally adjacent to and in contact with sidewalls of the first layer, such that a top portion of the first layer is between portions of the bottom electrode;

wherein a two-dimensional electron gas (2DEG) region is inducible in the first layer.

11. The device of claim 10, wherein the first single crystal III-N compound is gallium nitride, and the second single crystal III-N compound is aluminum nitride.

12. The device of claim 10, wherein the first single crystal III-N compound comprises gallium and nitrogen, and the second single crystal III-N compound comprises aluminum and nitrogen.

13. The device of claim 12, wherein the bottom electrode and the top electrode comprise tungsten or molybdenum.

14. The device of claim 10 further comprising a third layer comprising a third single crystal III-N compound under the first layer and adjacent to the air cavity.

15. The device of claim 10 wherein the insulation material lines the air cavity.

16. The FBAR device of claim 10, wherein the bottom electrode is on the insulation material, and at least part of the first layer is on the insulation material.

17. A mobile computing system comprising the integrated circuit device of claim 10.

18. A method of producing a resonator device, the method comprising:

depositing insulation material on a monocrystalline substrate;

etching a trench in the insulation material to expose the underlying substrate;

epitaxially depositing a first layer into the trench and so that the first layer laterally overflows onto an upper surface of the insulation material;

epitaxially depositing at least part of a second layer on the first layer to provide a two-dimensional electron gas (2DEG) region in the first layer adjacent to the second layer;

forming a bottom electrode laterally adjacent to and in contact with sidewalls of the first layer, such that a top portion of the first layer is between portions of the bottom electrode, the bottom electrode being on the insulation material and comprising metal; and forming an air cavity underneath at least a portion of the first layer.

19. The method of claim 18 further comprising forming a nucleation layer comprising a single crystal III-N material in the trench and on the substrate prior to depositing the first layer into the trench.

20. The method of claim 18 further comprising etching some of the insulation material to form the air cavity, wherein the bottom electrode is on a remaining portion of the insulation material, and at least part of the first layer is on the remaining portion of the insulation material.

* * * * *